(12) United States Patent
Zhang et al.

(10) Patent No.: US 12,346,025 B2
(45) Date of Patent: Jul. 1, 2025

(54) FLUORINE-CONTAINING RESIN COMPOSITION AND PREPARATION METHOD THEREOF, AND PREPARATION METHOD OF CURED FILM CONTAINING SAME

(71) Applicant: XI'AN MANARECO NEW MATERIALS CO., LTD., Xi'an (CN)

(72) Inventors: Yang Zhang, Xi'an (CN); Aiping Ma, Xi'an (CN); Pengfei Wang, Xi'an (CN); Qigui Li, Xi'an (CN); Shuang Liu, Xi'an (CN); Renxiao Gao, Xi'an (CN); Xiaowei Wang, Xi'an (CN)

(73) Assignee: XI'AN MANARECO NEW MATERIALS CO., LTD., Xi'an (CN)

( * ) Notice: Subject to any disclaimer, the term of this patent is extended or adjusted under 35 U.S.C. 154(b) by 633 days.

(21) Appl. No.: 17/754,068

(22) PCT Filed: Sep. 27, 2021

(86) PCT No.: PCT/CN2021/120972
§ 371 (c)(1),
(2) Date: Mar. 23, 2022

(87) PCT Pub. No.: WO2022/142537
PCT Pub. Date: Jul. 7, 2022

(65) Prior Publication Data
US 2023/0194984 A1 Jun. 22, 2023

(30) Foreign Application Priority Data
Dec. 30, 2020 (CN) .......................... 202011612200.4

(51) Int. Cl.
*G03F 7/039* (2006.01)
*C08F 220/24* (2006.01)
(Continued)

(52) U.S. Cl.
CPC .......... *G03F 7/0392* (2013.01); *C08F 220/24* (2013.01); *C08F 220/281* (2020.02);
(Continued)

(58) Field of Classification Search
None
See application file for complete search history.

(56) References Cited

U.S. PATENT DOCUMENTS 7,371,783 B2 * 5/2008 Tatsuzawa ............ G03F 7/0007
526/204
2003/0087184 A1 5/2003 Kishimura et al.
(Continued)

FOREIGN PATENT DOCUMENTS

CN 102207681 A 10/2011
CN 104136971 A 11/2014
(Continued)

OTHER PUBLICATIONS

English Translation of TW201537294 (Year: 2024).*
(Continued)

*Primary Examiner* — Mark F. Huff
*Assistant Examiner* — Kevin J Drummey

(57) ABSTRACT

The present disclosure discloses a fluorine-containing resin composition, including the following as raw materials, in parts by weight: a alkali-soluble resin (A) containing a compound (I), a photoinitiator, a sensitizer, a reactive
(Continued)

diluent, a solvent and an assistant; the structural formula of the monomer of the compound (I) is shown as follows:

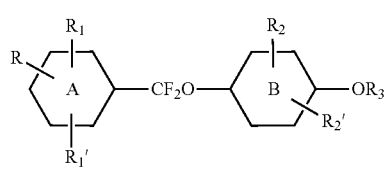

(I)

wherein R is selected from the group consisting of —CH=$CH_2$, —C($CH_3$)=$CH_2$, acryloyl and methacryloyl; $R_1$, $R_1'$, $R_2$, and $R_2'$ are each independently selected from the group consisting of hydrogen, hydroxyl, $C_1$-$C_4$ alkyl and $C_1$-$C_4$ alkoxy; $R_3$ is selected from the group consisting of hydrogen and C1-C6 alkyl; the A ring is selected from the group consisting of cyclohexyl and phenyl; and the B ring is selected from the group consisting of phenyl, naphthyl and anthryl.

8 Claims, 4 Drawing Sheets

(51) Int. Cl.
| | |
|---|---|
| *C08F 220/28* | (2006.01) |
| *C08F 220/32* | (2006.01) |
| *G02B 1/14* | (2015.01) |
| *G02B 5/20* | (2006.01) |
| *G03F 7/004* | (2006.01) |
| *G03F 7/027* | (2006.01) |
| *G03F 7/033* | (2006.01) |

(52) U.S. Cl.
CPC ............ *C08F 220/325* (2020.02); *G02B 1/14* (2015.01); *G02B 5/20* (2013.01); *G03F 7/004* (2013.01); *G03F 7/027* (2013.01); *G03F 7/033* (2013.01)

(56) References Cited

U.S. PATENT DOCUMENTS

| | | | |
|---|---|---|---|
| 2013/0065168 A1* | 3/2013 | De Keyzer | G02B 5/226 430/7 |
| 2015/0232757 A1 | 8/2015 | Kaneoya et al. | |
| 2020/0089116 A1* | 3/2020 | Kaneko | G03F 7/0045 |
| 2020/0124963 A1 | 4/2020 | Kaneko et al. | |
| 2020/0183280 A1 | 6/2020 | Ogawa et al. | |
| 2020/0233301 A1 | 7/2020 | Higo et al. | |
| 2020/0264461 A1* | 8/2020 | Kuwana | G02F 1/1336 |

FOREIGN PATENT DOCUMENTS

| | | | |
|---|---|---|---|
| CN | 104513145 A | | 4/2015 |
| CN | 107108795 A | | 8/2017 |
| CN | 107850693 A | | 3/2018 |
| CN | 111154498 A | | 5/2020 |
| CN | 112731765 A | | 4/2021 |
| CN | 112745453 A | | 5/2021 |
| TW | 201537294 A | * | 10/2015 |
| WO | 2013024764 A1 | | 2/2013 |

OTHER PUBLICATIONS

Office Action for Chinese Patent Application No. 202011612200.4 dated Nov. 8, 2023.
International Search Report issued for PCT/CN2021/120972 dated Dec. 31, 2021.

\* cited by examiner

FLUORINE-CONTAINING RESIN COMPOSITION AND PREPARATION METHOD THEREOF, AND PREPARATION METHOD OF CURED FILM CONTAINING SAME

CROSS REFERENCE TO RELATED APPLICATIONS

This application is the U.S. National Stage Application pursuant to 35 U.S.C. § 371 of International Patent Application No. PCT/CN2021/120972, filed on Sep. 27, 2021, which application claims priority under Articles 4 and 8 of the Stockholm Act of the Paris Convention for the Protection of Industrial Property to Chinese Patent Application No. 202011612200.4, filed on Dec. 30, 2020, which applications are hereby incorporated by reference in their entireties.

FIELD

The present disclosure relates to the technical field of resin synthesis, and in particular to a fluorine-containing resin composition and a preparation method thereof and a preparation method of a cured film containing same.

BACKGROUND

With the popularity of color liquid crystal displays (LCDs), people's requirements for color display of the liquid crystal displays are increasing. Color filters and thin film transistors are key components of LCDs to realize color display, and the flatness and light transmittance of their surfaces directly affect the performance of displays.

In order to improve the performance of the color filter, in the production of the color filter, a layer of cured film of resin material, i.e., OC film (Over Coat), can be further spun on a filter film forming surface as a protective layer, for improving the flatness and light transmittance of the surface of the color filter film, and meanwhile, it is required to have good heat resistance and strength to protect the filter film from damage and prolong the service life. Similarly, in a thin film transistor (TFT) type liquid crystal display element, the cured film is usually used as an interlayer insulating film to cover the TFT element. The interlayer insulating film is mainly used for insulation, protection and planarization among the film layers.

With the development trend of high-brightness, upsizing and high-response of the displays and the continuous improvement of the film formation processes in display devices, it is required that a resin composition for forming the cured film has good coating performance, higher electrical insulating property and light transmittance, and meanwhile has better chemical resistance, heat resistance, hardness and a better adhesive force to meet the demands.

Therefore, it is an urgent problem for those skilled in the art to develop a resin composition which can be used as cured film materials, such as color filter protective film (OC film) of the LCD and interlayer insulating film of the TFT.

SUMMARY

In view of this, the present disclosure provides a fluorine-containing resin composition having good coating performance, electrical insulating property and light transmittance, and meanwhile having better chemical resistance, heat resistance, hardness and better adhesive force, and a preparation method thereof.

In order to achieve the above object, the present disclosure provides the following technical solutions: a fluorine-containing resin composition, comprising the following as raw materials, in parts by weight: 18 to 42 parts of a alkali-soluble resin (A) containing a compound (I), 2 to 8 parts of a photoinitiator, 0.3 to 1.2 parts of a sensitizer, 0 to 15 parts of a reactive diluent, 60 to 90 parts of a solvent, and 1 to 8 parts of an assistant; the structural formula of the monomer of the compound (I) is shown as:

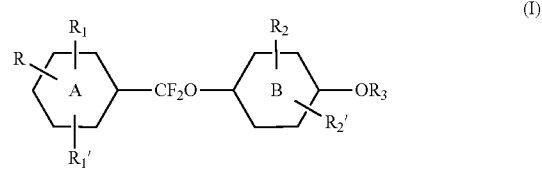

wherein R is selected from the group consisting of —CH=CH$_2$, —C(CH$_3$)=CH$_2$, acryloyl and methacryloyl; R$_1$, R$_1$', R$_2$, and R$_2$' are each independently selected from the group consisting of hydrogen, hydroxyl, C$_1$-C$_4$ alkyl and C$_1$-C$_4$ alkoxy; R$_3$ is selected from the group consisting of hydrogen and C$_1$-C$_6$ alkyl; the A ring is selected from the group consisting of cyclohexyl and phenyl; and the B ring is selected from the group consisting of phenyl, naphthyl and anthryl.

The present disclosure has the following beneficial effects: in the present disclosure, the fluorine-containing resin composition has good coating performance, electrical insulating property and light transmittance, and meanwhile has better chemical resistance, heat resistance, hardness and better adhesive force.

In some embodiments, the structural formula of the monomer of the compound (I) is shown as any one of the following structural formulas:

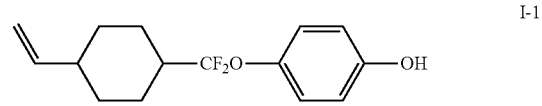

I-1

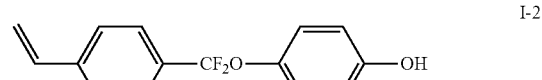

I-2

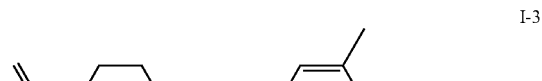

I-3

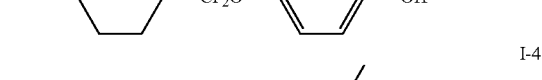

I-4

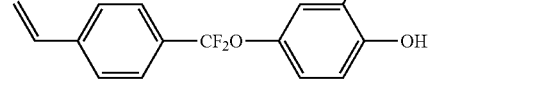

I-5

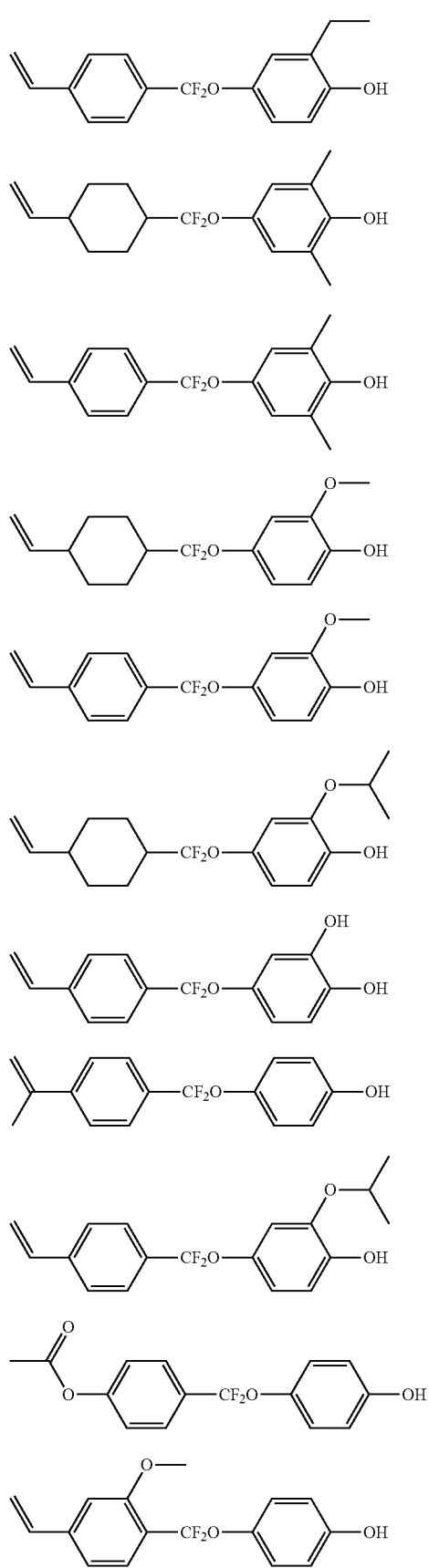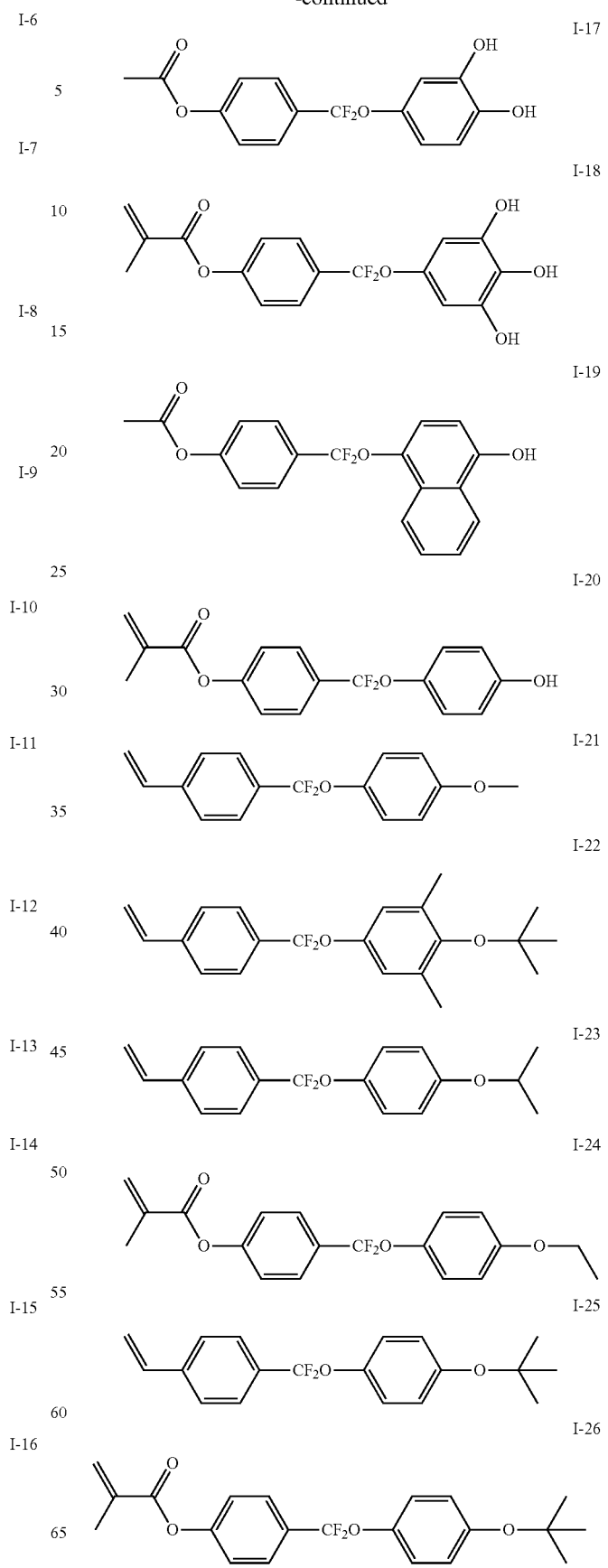

-continued

I-27
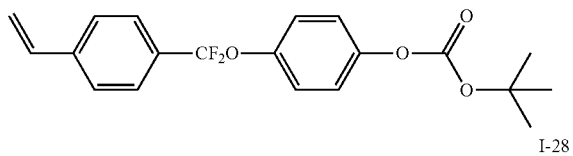

I-28
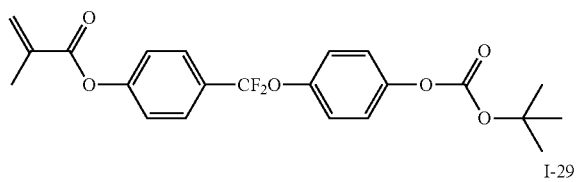

I-29
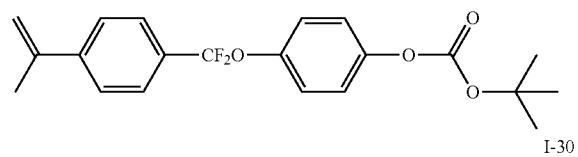

I-30
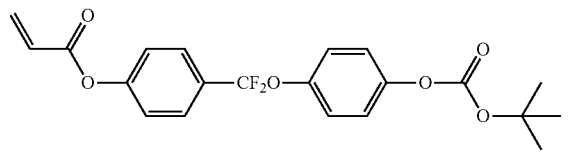

In some embodiments, a method for preparing the alkali-soluble resin (A) is performed as follows: adding 2 to 5 parts of a monomer of a compound (I), 1 to 5 parts of an acrylic monomer, 10 to 30 parts of a acrylate monomer, 2 to 5 parts of a maleimide monomer, 1 to 5 parts of an initiator, 0.2 to 1.0 parts of a molecular weight regulator and 50 to 84 parts of an organic solvent into a three-necked flask for mixing under stirring, and heating to 75-80° C., and holding the temperature to react for 3-6 h, and cooling to room temperature to terminate the reaction, to obtain the alkali-soluble resin (A), wherein the usage amount of the compound (I) is in a range of 8%-15% as converted according to the solid content of the alkali-soluble resin (A).

In some embodiments, the acrylic monomer is methacrylic acid; the acrylate monomer is one at least selected from the group consisting of methyl methacrylate, lauryl methacrylate, tetrahydrofurfuryl methacrylate and glycidyl methacrylate; the maleimide monomer is N-cyclohexyl maleimide; the initiator is azobisisoheptonitrile; and the molecular weight regulator is an α-methylstyrene dimer.

In some embodiments, the photoinitiator is prepared by a condensation reaction of a phenolic compound and 215-nitrine naphthoquinone sulfonyl chloride according to a molar ratio of 1:0.5-1:4; wherein the photoinitiator is prepared by condensing 215-nitrine naphthoquinone sulfonyl chloride with the phenolic compound according to the selected molar ratio of 50% to 100% relative to the number of hydroxyl in the phenolic compound.

In some embodiments, the phenolic compound is one at least selected from the group consisting of 4-hydroxybenzophenone, 2,4-dihydroxybenzophenone, 2,4,6-trihydroxybenzophenone, 2,3,4-trihydroxybenzophenone, 2,2',4,4'-tetrahydroxybenzophenone, 2,3,4,4'-tetrahydroxybenzophenone, 2,3,4,2',6'-pentahydroxybenzophenone, 2,3,4,3',4',5'-hexahydroxybenzophenone, 3,4,5,3',4',5'-hexahydroxybenzophenone, bisphenol A, spirobiindane, cresol trimer, tris(4-hydroxyphenyl)methane, 1,1,1-tris(tetrahydrohydroxyphenyl)ethane, 1,1,1-tris(4-hydroxyphenyl)propane, 1,1,1-tris(4-hydroxyphenyl)butane, 1,1-bis(4-hydroxyphenyl)cyclohexane, and α,α,α'-tris(4-hydroxyphenyl)-1-ethyl-4-cumene.

In some embodiments,

-continued

| | Phenols | 215-nitrine naphthoquinone sulfonyl chloride | Molar Ratio |
|---|---|---|---|
| B-4 | (2,3,4-trihydroxybenzophenone structure) | | 1:1-1:3 |
| B-5 | (2,3,4,4'-tetrahydroxybenzophenone structure) | | 1:1-1:4 |
| B-6 | (spirobisindane structure) | | 1:1-1:4 |
| B-7 | (cresol trimer structure) | | 1:1-1:3 |
| B-8 | (bisphenol A trimer structure) | | 1:1-1:3 |

The above B-1 represents as 4-hydroxybenzophenone; B-2 represents as 4,4'-dihydroxybenzophenone; B-3 represents as 2,4-dihydroxybenzophenone; B-4 represents as 2,3,4-trihydroxybenzophenone; B-5 represents as 2,3,4,4'-tetrahydroxybenzophenone; B-6 represents as spirobisindane; B-7 represents as cresol trimer, and B-8 represents as bisphenol A.

The development mechanism of such photoinitiator is that during the compounding process, the nitrine structure in the photoinitiator forms hydrogen bonds with the hydroxyl and carboxyl in the resin, which leads to reduce the alkali solubility of the resin; moreover, under a ultraviolet light, the nitrine naphthoquinone group releases $N_2$, and rearranges to generate ninhydric acid, and the generated hydrogen bonds are destroyed, and the illuminated part of the product is once again converted to alkali soluble, while the non-illuminated area is insoluble, forming a dissolution difference.

In some embodiments, the photoinitiator is prepared by a condensation reaction of one of B-4, B-5 and B-8 with 215-nitrine naphthoquinone sulfonyl chloride, and more preferably prepared by a condensation reaction of B-8 with 215-nitrine naphthoquinone sulfonyl chloride according to a molar ratio of (1:0.5)-(1:4).

The examples of commercialized products are one at least selected from the group consisting of NT-200, NT-250, 4NT-250, 4NT-300, 4NT-350, TPPA-200 and TPPA-250 (Toyo Gosei).

In some embodiments, the photoinitiator is one at least selected from the group consisting of a phosphorus salt, an iodonium salt, an o-nitrobenzyl salt, an oxime ketone ester and a triazine compound.

In some embodiments, the phosphorus salt is diphenyl [(phenylthio)phenyl]sulfonium hexafluorophosphate and/or bis(4,4'-thioether triphenylsulfonium)hexafluorophosphate; the iodonium salt is one at least selected from the group consisting of bithiophene cyclic iodonium salt, fluorenone phenyl iodonium salt and polystyrene iodine germanium-hexafluoroantimonate; the o-nitrobenzyl salt is N,N-bis(2-aminoethyl)-N-(2-nitrobenzyl)amine trihydrate; and the examples of commercialized products of the oxime ketone ester is one at least selected from the group consisting of OXE02, PBG-304, OXE01 and PBG-30.

The triazine compound is one at least selected from the group consisting of 2-(1,3-benzodioxolan-5-yl)-4,6-bis(trichloromethyl)-1,3,5-triazine, PAG-201, PAG-202 and PAG-20101.

In some embodiments, the sensitizer is 4-hydroxybenzophenone and/or 4,4'-dihydroxybenzophenone.

The above technical schemes have the following beneficial effects: the sensitizer is usually used in combination with the photoinitiator, and its function is to reduce the hydrogen bonding degree between the photoinitiator and the resin, and to improve photosensitivity, and to enhance the dissolution difference and to improve resolution.

The reactive diluent is a methacrylate monomer or a alicyclic monomer having a heterocyclic structure.

In some embodiments, the dosage of the reactive diluent is in a range of 5 to 10 parts by weight. Wherein, the methacrylate is one at least selected from the group consisting of hydroxyethyl methacrylate, benzyl methacrylate, pentaerythritol triacrylate, dipentaerythritol pentaacrylate, dipentaerythritol hexaacrylate, propoxy glycerol triacrylate, phenoxyethyl methacrylate, trimethylolpropane triacrylate and 1,6-hexanediol diacrylate; and the alicyclic monomer having a heterocyclic structure is one at least selected from the group consisting of N-acryloylmorpholine, glycidyl methacrylate, 4-tert-butyl cyclohexyl acrylate and methyl 2-(oxetan-3-ylidene)acetate.

The dosage of the reactive diluent is in a range of 5 to 10 parts by weight.

In some embodiments, the solvent is one at least selected from the group consisting of a diethylene glycol alkyl ether compound, a dipropylene glycol alkyl ether compound, a propylene glycol monoalkyl ether compound, a propylene glycol monoalkyl ether acetate compound, a N,N-dimethylamide compound, a lactate compound, ketone and a 3-alkoxypropionate compound; and the assistant is one at least selected from the group consisting of a surfactant, a defoaming agent, an antioxidant and a coupling agent.

In some embodiments, the diethylene glycol alkyl ether compound is one at least selected from the group consisting of diethylene glycol dimethyl ether, diethylene glycol diethyl ether and diethylene glycol methyl ethyl ether; the dipropylene glycol alkyl ether compound is dipropylene glycol dimethyl ether and/or dipropylene glycol diethyl ether; the propylene glycol monoalkyl ether compound is propylene glycol monomethyl ether and/or propylene glycol monoethyl ether; the N,N-dimethyl amide compound is N,N-dimethyl formamide and/or N,N-dimethyl acetamide; the lactate compound is methyl lactate and/or ethyl lactate; the ketone is cyclobutanone and/or cyclopentanone; and the 3-alkoxy propionate compound is one at least selected from the group consisting of ethyl 3-methoxypropionate, propyl 3-methoxypropionate, methyl 3-ethoxypropionate, ethyl 3-ethoxypropionate, propyl 3-ethoxypropionate and diethylene glycol monobutyl ether acetate.

In some embodiments, the surfactant is organosilicon surfactant, and examples of commercialized products are one at least selected from the group consisting of KP-341, KP-340, BYK-330, BYK-333, BYK-378 and BYK-340; alternatively, fluorine-containing surfactant, and examples of commercialized products are one at least selected from the group consisting of R40, R42, R41, F443, F554, F556 and F563; the defoaming agent is organosilicon defoaming agent, and examples of commercialized products are BYK-020 and/or BYK-022; the antioxidant is hindered phenolic antioxidant or phosphite antioxidant, and examples of commercialized products are one at least selected from the group consisting of 1010, 1076, 1024, 1098, BHT, CHEMNOX 168, CHEMNOX 626, CHEMNOX B225 and CHEMNOX B561; and the coupling agent is organosilicon coupling agent or melamine coupling agent, and examples of commercialized products are one at least selected from the group consisting of KBM403, KBM503, Z-6040 and Z603.

The present disclosure also provides a method for preparing the fluorine-containing resin composition, comprising: weighing respective raw materials in parts by weight according to the fluorine-containing resin composition, and stirring uniformly, and filtering the obtained mixture with a filter membrane with a thickness of 0.1-0.5 μm to obtain the fluorine-containing resin composition.

In some embodiments, the solid component concentration of the fluorine-containing resin composition is in a range of 10%-70%, and more preferably 15%-50%.

In some embodiments, the filter membrane used in the filtering has a thickness of 0.2 μm.

The present disclosure also provides a method for preparing a cured film, comprising: coating the fluorine-containing resin composition on the surface of a substrate, and subjecting to a soft baking, a exposure, a development, a UV irradiation and a hardening to obtain the cured film.

In some embodiments, the material of the substrate is any one selected from the group consisting of metal plane, silicon wafer and glass, and more preferably glass; the thin film coating is conducted by any one selected from the group consisting of spray coating, spin coating and slit coating, and preferably the spin coating; and the thickness of the formed film could be adjusted as required by adjusting the rotation speed, and more preferably in a range of 2 μm-5 μm used as a planarization insulating film.

In some embodiments, the soft baking is conducted at a temperature of 90° C.-130° C. for 120 s-200 s.

The above technical schemes have the following beneficial effects: the objective of the soft baking is mainly to remove the solvent from the thin film.

In some embodiments, the value of the exposure is in a range of 80 mJ-200 mJ; and in this procedure, the thin film is covered with a masking engraved with a certain pattern characteristic, and irradiated with a ray; the ray is one selected from the group consisting of an X-ray, an electron beam and an ultraviolet ray, wherein more preferably the ultraviolet ray.

The ultraviolet ray used in the exposure is one at least selected from the group consisting of an i-ray (with a wavelength of 365 nm), a g-ray (with a wavelength of 436 nm) and a far ultraviolet ray (e.g., KrF), wherein more preferably one selected from the group consisting of the i-ray, the g-ray and a mixed ray of the i-ray and the g-ray.

In some embodiments, the development is performed by: cleaning with a cleaning solvent; wherein the cleaning solvent is an aqueous solution selected from the group consisting of sodium hydroxide, potassium hydroxide and tetramethylammonium hydroxide, and more preferably 2.38% by mass percentage tetramethylammonium hydroxide; and the development is conducted at 23° C. for 60 s-120 s.

In some embodiments, the light intensity of the UV irradiation is in a range of 100-2000 mj/cm$^2$, and more preferably 200-1000 mj/cm$^2$.

The above technical schemes have the following beneficial effects: the remaining photoinitiator is completely destroyed, and the film is cured more fully in the process of the hardening.

In some embodiments, the hardening is performed by: baking the developed thin film at a temperature of 150-250° C.

BRIEF DESCRIPTION OF THE DRAWINGS

In order to describe the technical schemes in the embodiments of the present disclosure or in the prior more clearly, the following will briefly introduce the drawings required to be used in the description of the examples or the prior art. It is evident that the drawings in the following description are merely examples of the present disclosure, and those ordinary skilled in the art may still obtain other drawings based on the provided drawings without creative work.

FIG. 4-1 is an SEM image showing the evaluation of graphic morphology in the present disclosure.

FIG. 4-2 is a micrograph showing the evaluation of graphic morphology in the present disclosure.

DETAILED DESCRIPTION

Figure 1:
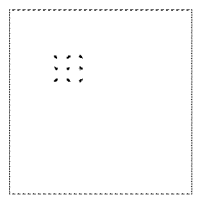
FIG. 1 shows a schematic structural diagram of film uniformity evaluation of the cured film in the present disclosure.

The technical schemes in the examples of the present disclosure will be clearly and completely described below with reference with drawings in the examples. It is evident that the described examples are only a part of examples and not all of them. Based on the examples of the present disclosure, all other examples obtained by those ordinary skilled in the art without creative work shall fall within the protection scope of the present disclosure.

EXAMPLE 1

The synthesis of a alkali-soluble resin A-1 was performed by the following steps: Under the protection of nitrogen, 22.0 kg of diethylene glycol diethyl ether, 1.0 kg of methacrylic acid, 1.0 kg of methyl methacrylate, 6 kg of tetrahydrofurfuryl methacrylate, 1.0 kg of a compound 1-2, 1.0 kg of N-cyclohexylmaleimide, 0.5 kg of azobisisobutyronitrile and 0.5 kg of an α-methylstyrene dimer were added into a three-necked flask, heated to 78° C. under stirring, held at the temperature for 4 h to react, and cooled to room temperature to terminate the reaction.

EXAMPLE 2

The synthesis of a alkali-soluble resin A-2 was performed by the following steps: Under the protection of nitrogen, 22.0 kg of diethylene glycol dimethyl ether, 1.0 kg of methacrylic acid, 0.5 kg of lauryl methacrylate, 6 kg of glycidyl methacrylate, 0.5 kg of dicyclopentyl methacrylate, 1.0 kg of a compound 1-25, 1.0 kg of N-cyclohexylmaleimide, 0.5 kg of azodiisoheptononitrile and 0.5 kg of an α-methylstyrene dimer were added into a three-necked flask, heated to 78° C. under stirring, held at the temperature for 4 h to react, and cooled to room temperature to terminate the reaction.

EXAMPLE 3

The synthesis of a alkali-soluble resin A-3 was performed by the following steps: Under the protection of nitrogen, 22.0 kg of diethylene glycol methyl ethyl ether, 1.0 kg of methacrylic acid, 0.5 kg of lauryl methacrylate, 4 kg of glycidyl methacrylate, 2 kg of tetrahydrofurfuryl methacrylate, 0.5 kg of dicyclopentyl methacrylate, 1.0 kg of a compound 1-26, 1.0 kg of N-cyclohexylmaleimide, 0.5 kg of azodiisoheptonitrile and 0.5 kg of an α-methylstyrene dimer were added into a three-necked flask, heated to 78° C. under stirring, held at the temperature for 4 h to react, and cooled to room temperature to terminate the reaction.

COMPARATIVE EXAMPLE 1

The synthesis of a copolymer A-4 was performed by the following steps: Under the protection of nitrogen, 22.0 kg of diethylene glycol methyl ethyl ether, 1.0 kg of methacrylic acid, 0.5 kg of lauryl methacrylate, 4 kg of glycidyl methacrylate, 2 kg of tetrahydrofurfuryl methacrylate, 0.5 kg of dicyclopentyl methacrylate, 1.0 kg of 4-hydroxyphenyl methacrylate, 1.0 kg of N-cyclohexylmaleimide, 0.5 kg of azodiisoheptonitrile and 0.5 kg of an α-methylstyrene dimer were added into a three-necked flask, heated to 78° C. under stirring, held at the temperature for 4 h to react, and cooled to room temperature to terminate the reaction.

Wherein, CF$_2$O monomer was replaced.

COMPARATIVE EXAMPLE 2

The synthesis of a copolymer A-5 was performed by the following steps: Under the protection of nitrogen, 22.0 kg of diethylene glycol methyl ethyl ether, 1.0 kg of methacrylic acid, 0.5 kg of lauryl methacrylate, 4 kg of glycidyl methacrylate, 2 kg of tetrahydrofurfuryl methacrylate, 0.5 kg of dicyclopentyl methacrylate, 1.0 kg of 4'-tert-butoxy-(1,1'-biphenyl)-methacrylate, 1.0 kg of N-cyclohexylmaleimide, 0.5 kg of azodiisoheptonitrile and 0.5 kg of an α-methylstyrene dimer were added into a three-necked flask, heated to 78° C. under stirring, held at the temperature for 4 h to react, and cooled to room temperature to terminate the reaction.

Wherein, CF$_2$O monomer was replaced.

1. Testing of polymer (A) alkali-soluble resin
(1) GPC
Instrument: waters (515-2414)
Gel column: Shimadzu KF801+KF802+KF803
Solvent: THF
Flow rate: 0.8 mL/min
(2) Transmittance
Instrument: Shimadzu UV-2600
Determination manner: transmissivity
Wavelength range: 200 nm-800 nm
(3) TGA
Instrument: TGA-Q50 manufactured by TA in US
Heating rate: 10° C./min, heating to 800° C.

(4) The solid content of the resin was tested by: 1.0000 g of a resin solution was taken, baked at 120° C. for 2 h, and weighed, and an average value of three parallel samples was taken.

Solid content=(baked weight/weight before baking)× 100%.

The test results of performance of the polymer (A) were as follows (Table 1):

| Polymer | TGA | Transmittance | Solid Content | Viscosity | Molecular Weight (Mw) |
|---|---|---|---|---|---|
| A-1 | 252.9° C. | 95.4% | 28.2% | 68 cP | 12800 |
| A-2 | 255.3° C. | 95.8% | 27.8% | 58 cP | 10200 |
| A-3 | 257.4° C. | 96.5% | 28.4% | 65 cP | 12400 |

-continued

| Polymer | TGA | Transmittance | Solid Content | Viscosity | Molecular Weight (Mw) |
|---|---|---|---|---|---|
| A-4 | 242.0° C. | 96.4% | 27.5% | 60 cP | 10800 |
| A-5 | 255.6° C. | 90.1% | 28.0% | 65 cP | 11600 |

The raw materials of resin compositions prepared in Examples 4-13 and Comparative Examples 3-4 were shown in Table 2, in which the copolymer (A) alkali-soluble resin was prepared in Examples 1-3 and Comparative Example 1-2, wherein the resin compositions prepared in Examples 3-9 could be used for interlayer insulating films, and the resin compositions prepared in Examples 7-8 could be used for chemically-amplified interlayer insulating films, and the resin compositions prepared in Examples 12-13 could be used for OC films.

TABLE 2-1

The raw materials of resin compositions prepared in Examples 4-13 and Comparative Examples 3-4 (unit kg)

| | Components | Example 4 | Example 5 | Example 6 | Example 7 | Example 8 | Example 9 | Example 10 | Example 11 | Example 12 | Example 13 | Comparative Example 1 | Comparative Example 2 |
|---|---|---|---|---|---|---|---|---|---|---|---|---|---|
| Resin | A-1 | 42 | 42 | 42 | 42 | 36 | 36 | 20 | 30 | | | | |
| | A-2 | | | | | | | 28 | 18 | | | | |
| | A-3 | | | | | | | | | 40 | 40 | | |
| | A-4 | | | | | | | | | | | 42 | |
| | A-5 | | | | | | | | | | | | 42 |
| Solvent | Propylene glycol monomethyl ether | 18 | 18 | 18 | 18 | 18 | 18 | 16 | 16 | 18 | 18 | 18 | 18 |
| | Diethylene glycol diethyl ether | 22 | 22 | 27 | 28.7 | 22 | 27 | 18 | 18 | 22 | 22 | 22 | 22 |
| | Methyl 3-ethoxypropionate | 5 | 5 | | | 5 | | 5 | 5 | | | 5 | 5 |
| | Propylene glycol methyl ether acetate | 3.7 | 3.7 | | | 3.7 | 3.7 | | | 9 | 9 | 3.7 | |
| | Ethylene glycol monobutyl ether acetate | | | 3.7 | | | 3.7 | 3 | 3 | | | | 3.7 |
| Photoinitiator | 4NT-250 | 3.2 | 3.2 | 3.2 | 3.2 | 3.2 | 3.2 | | | 3.2 | | 3.2 | 3.2 |
| | NT-200 | 0.8 | 0.8 | 0.8 | 0.8 | 0.8 | 0.8 | | | 0.8 | | 0.8 | 0.8 |
| | Diphenyl[(phenylthio)phenyl]sulfonium hexafluorophosphate | | | | | | | 3.5 | 3.5 | | | | |
| | Fluorenone phenyl iodonium salt | | | | | | | 1.5 | 1.5 | | | | |
| | PAG201 | | | | | | | | | 2.4 | 3.6 | | |
| | PBG-304 | | | | | | | 0.5 | 0.5 | 0.2 | 0.2 | | |
| Sensitizer | 4-hydroxybenzophenone | 0.3 | 0.3 | 0.3 | 0.3 | 0.3 | 0.3 | | | | 0.3 | 0.3 | 0.3 |
| | UV-184 | | | | | | | | | 1.2 | | | |
| Reactive diluent | N-acryloylmorpholine | 0.75 | | 0.75 | | 1.75 | 1.75 | 0.25 | 0.25 | | | 0.75 | |
| | Dipentaerythritol hexaacrylate | 0.75 | 1.5 | 0.75 | 1.5 | 1.75 | 1.75 | 0.25 | 0.25 | 0.5 | 0.5 | 0.75 | 1.5 |
| | Glycidyl methacrylate | 2 | 2 | 2 | 2 | 5 | 5 | 1.2 | 1.2 | 1 | 1 | 2 | 2 |
| | Benzyl methacrylate | | | | | | | 1 | 1 | | | | |
| | Hexanediol diacrylate | | | | | | | | | 1.2 | 1.2 | | |
| | Hydroxy ethyl methacrylate | | | | | | | | | 1.75 | 1.75 | | |

TABLE 2-1-continued

The raw materials of resin compositions prepared in Examples 4-13 and Comparative Examples 3-4 (unit kg)

| | Components | Example 4 | Example 5 | Example 6 | Example 7 | Example 8 | Example 9 | Example 10 | Example 11 | Example 12 | Example 13 | Comparative Example 1 | Comparative Example 2 |
|---|---|---|---|---|---|---|---|---|---|---|---|---|---|
| Coupling agent | KBM403 | 1.2 | 1.2 | 1.2 | 1.2 | 1.2 | 1.2 | 1.5 | 1.5 | 2.4 | 2.4 | 1.2 | 1.2 |
| Antioxidant | BHT | 0.25 | 0.25 | 0.25 | 0.25 | 0.25 | 0.25 | 0.25 | 0.25 | 0.3 | 0.3 | 0.25 | 0.25 |
| Leveling Agent | KP340 | 0.05 | 0.05 | 0.05 | 0.05 | 0.05 | 0.05 | 0.05 | 0.05 | 0.05 | 0.05 | 0.05 | 0.05 |

The methods for preparing the above Examples 4-13 and Comparative Examples 3-4 were all performed by: the above raw materials were dissolved in a clean environment with yellow light, dissolved under stirring at a controlled temperature of 20° C. to 25° C. for 2 h, and filtered through a filter with a pore size of 0.2 μm, obtaining a resin composition.

The method for preparing the cured films of Examples 14-23 was performed by: the solutions of the resin compositions prepared in Examples 4-13 were coated on a TFT glass substrate (Corning® EAGLE XG) with a size of 100 mm×100 mm×0.7 mm by using a rotary spin coater, subjected to a soft baking on a hot plate at 110° C. for 120 s, and then conducted an exposure at an exposure amount of 1,000 mj/cm$^2$ by using an MJB4 exposure machine manufactured by SUSS, and subsequently subjected to a hardening in a clean oven at 230° C. for 40 min to form a cured film with a thickness of 2 μm on the TFT glass substrate.

A method for preparing the cured films of Comparative Examples 5-6 was the same as that of Examples 14-23.

Evaluation of the Physical Properties of the Cured Film

1. Evaluation of the Surface of the Cured Film

The surfaces of the films of Examples 14-23 and Comparative Examples 5-6 were irradiated with a sodium lamp, and the flatness of the surfaces of the films was visually observed. The results were shown in Table 3.

2. Evaluation of Film Uniformity

For the films of Examples 14-23 and Comparative Examples 5-6, regions of 1 cm×1 cm were selected on the substrate covered with the film surface, and nine points were taken (as shown in FIG. 1).

The film thicknesses at different points were respectively detected by using a VASE ellipsometer (VB-400 manufacture by J. A. Woollam in U.S.), and calculated the film uniformity according to the following equation:

Detection was conducted at three different parts on the surface of the specimen, and an average value was taken. It was recorded as A, when the film uniformity was less than or equal to 2.0%, and as B when the film uniformity was in a range of 2.0%-4.0%, and as C when the film uniformity was more than or equal to 4.0%. The results were shown in Table 3.

3. Evaluation of Film Adhesion

For the films of Examples 14-23 and Comparative Examples 5-6, the above substrate coated with the film was placed on a hard and flat object surface with its film face up. A scribing tester (BYK 5123, with a cutter tooth number of 11 and a cutter tooth spacing of 1 mm) was used, and a cutting knife was held so that the knife was perpendicular to the surface of the sample plate, and a force was applied evenly to scribe 11 parallel cutting lines in a stable manner; and then 11 parallel cutting lines that were crossed vertically with the original cutting lines at an angle of 90° to form a grid pattern, and all the cuts needed to penetrate the surface of the substrate. A banister brush was used for gently sweeping backward for several times and then forward for several times along each diagonal line of the grid pattern. An adhesive tape (a 3M 610 adhesive tape) was applied onto the surface of the film, wherein the forefront section of the adhesive tape was removed, then the adhesive tape with a length of about 75 mm was cut off and applied onto the surface of the film with its center point being placed above the grid and flattened, the length of the adhesive tape should at least exceed the grid by 20 mm, and it was ensured that it is in complete contact with the surface of the film. Within 5 min of sticking the adhesive tape, the dangling end of the adhesive tape was held, and the adhesive tape was torn away smoothly within 0.5-1.0 s at an angle of 60° with the surface of the film as far as possible, and then the falling off condition of the surface of the film was observed with a microscope. The test was conducted on three different parts on the surface of the sample, and the grades of the grid scribing test were recorded.

It was recorded as A when the cutting edge was completely smooth and no grid fell off, and recorded as B when there was a little separation of the membrane layer at the intersection of cuts and the affected grid scribing region was no more than 5%, and recorded as C when the affected grid scribing region was more than 5%. The results were shown in Table 3.

4. Evaluation of Film Hardness

For the films of Examples 14-23 and Comparative Examples 5-6; the above substrate coated with the film was placed on a hard and flat object surface with its film face up, and a set of advanced drawing pencils conforming to GB 149, i.e., the pencil grades, such as 6H, 5H, 4H, 3H, 2H, H, HB, B, 2B, 3B, 4B, 5B and 6B, was used so that the refill was exposed to 4-6 mm, and it was polished vertically with a sandpaper until the end face was flat and the edge was sharp. A portable pencil hardness tester (QHO-A) was used as being pushed forward vigorously starting from the 6H pencil, wherein scribing with each grade of pencil was for 5 times, if there were 2 times of film scratch in each grade, a pencil of another grade was replaced until there was a pencil that could not scratch the film for at least 4 times, and the corresponding hardness values were recorded. The results were shown in Table 3.

5. Evaluation of Film Transmittance

For the films of Examples 14-23 and Comparative Examples 5-6, the light transmittance of the glass substrate with the cured film was measured by using a spectrophotometer [Shimadzu UV2600] at a wavelength in the range of 400-800 nm. When the value of the minimum light transmittance was above 95%, the transparency was considered to be good. The results were shown in Table 3.

6. Evaluation of Film Heat Resistance

Figure 3:
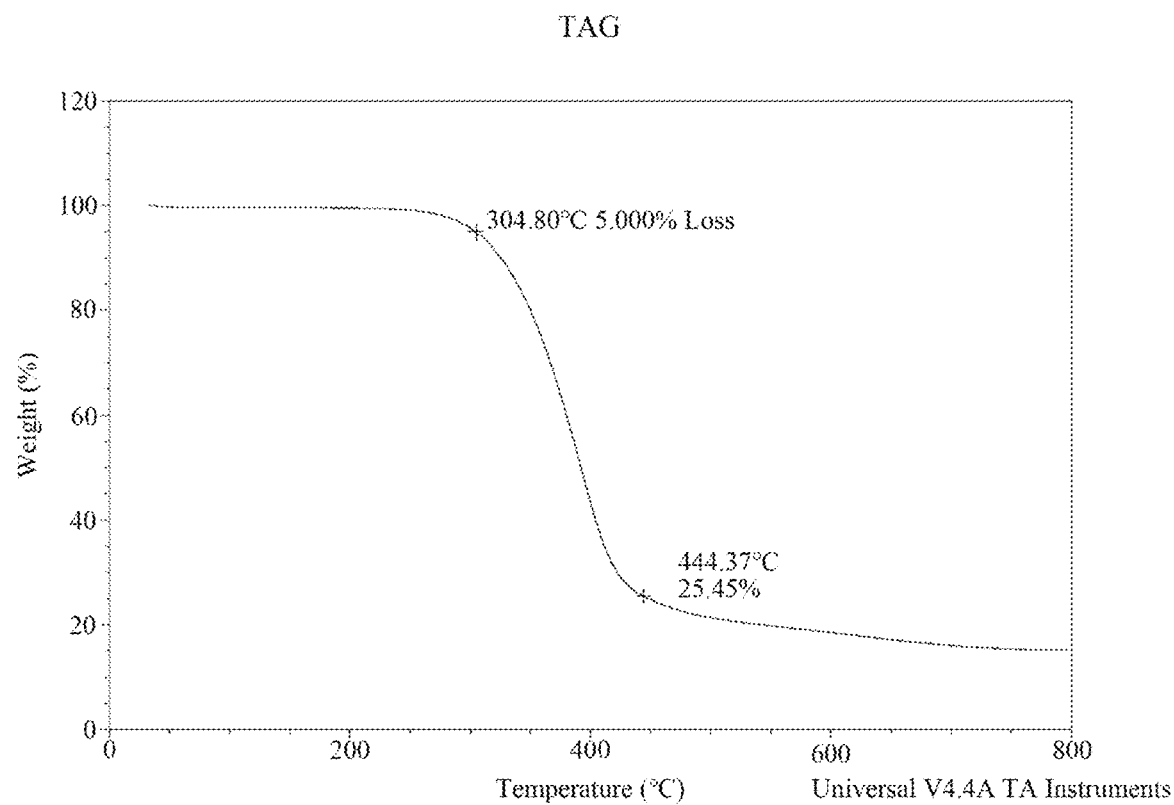
FIG. 3 is a TGA diagram showing the evaluation of heat resistance of the film in the present disclosure.

For the films of Examples 14-23 and Comparative Examples 5-6, the cured film was peeled off, and measured by TGA for a temperature at which its weight loss was 5%. The results were shown in Table 3, and the TGA diagram of the examples was shown in FIG. 3.

7. Evaluation of Solvent Resistance of Film

For the films of Examples 14-23 and Comparative Examples 5-6, the transmittance T2 of the cured film was measured by a spectrophotometer [Shimadzu UV2600] at 400 nm. Then, the sample was cut into two pieces with the same size, and the two pieces were respectively soaked in N-methylpyrrolidone (NMP) and isopropanol (IPA) at 25° C. for 60 min. After the solvent was blown off with a $N_2$ gun, the transmittances $T_{NMP}$ and $T_{IPA}$ of the cured film were respectively detected at 400 nm, and the solvent resistance change rate of the cured film was calculated according to the following equation:

$$\text{Solvent resistance change rate} = \frac{T2 - T_{NMP}(T_{IPA})}{T2} \times 100\%$$

The results of the solvent resistance change rate of the cured film were shown in Table 3. It was considered that the solvent resistance was good when the value was below 2%.

8. Evaluation of Film Alkali Resistance

For the films of Examples 14-23 and Comparative Examples 5-6, the film thickness T3 of the cured film was measured, and then the sample was soaked in an aqueous solution of 5% by mass potassium hydroxide at 25° C. for 60 min, and then the film layer was cleaned with ultrapure water, and blown dry with a $N_2$ gun. Then the film thickness T3' of the cured film was measured, and the thickness change rate of the alkali-resistant film was calculated according to the following equation:

$$\text{the thickness change rate of the alkali-resistant film} = \frac{T3 - T3'}{T3} \times 100\%$$

The results of the thickness change rate of the alkali-resistant film were shown in Table 3. It was considered that alkali resistance was good when the value was below 5%.

9. Evaluation of Sensitivity

The solutions of the resin compositions of Examples 4-13 and Comparative Examples 3-4 were coated on a TFT glass substrate (Corning® EAGLE XG) of 100 mm×100 mm×0.7 mm by using a rotary spin coater, and subjected to a baking on a hot plate at 110° C. for 120 s, forming a film with a thickness of 2.2 μm. The film layer was exposed by inserting the graphic masks of different resolutions and patterns by using a MJB4 exposure machine manufactured by SUSS for varied exposure times. Then, a developing treatment was conducted with an aqueous solution of 2.38% by mass tetramethylammonium hydroxide (developing solution) at 25° C. by static method, and the development was conducted for 60 s. After development, the film layer was cleaned with ultrapure water, blown dry with an $N_2$ gun, and hardened in a clean oven at 230° C. for 40 min, forming a pattern on the substrate. After the exposure-development-hardening treatment, the exposure amount required for the complete development of the pattern at 5 μm was detected, and this value was used as the sensitivity. The measurement results were shown in table 3, and it was considered that the sensitivity was good when this value was less than 100 mj/cm².

10. Evaluation of Graphic Morphology

The preparation method was the same as that used in the above sensitivity evaluation, in which a pattern with a film thickness of 2 μm was formed on the glass substrate with the exposure amount required in the sensitivity evaluation. The shape of the pattern formed in this way was observed with a scanning electron microscope (SEM).

Figures 1, 4:
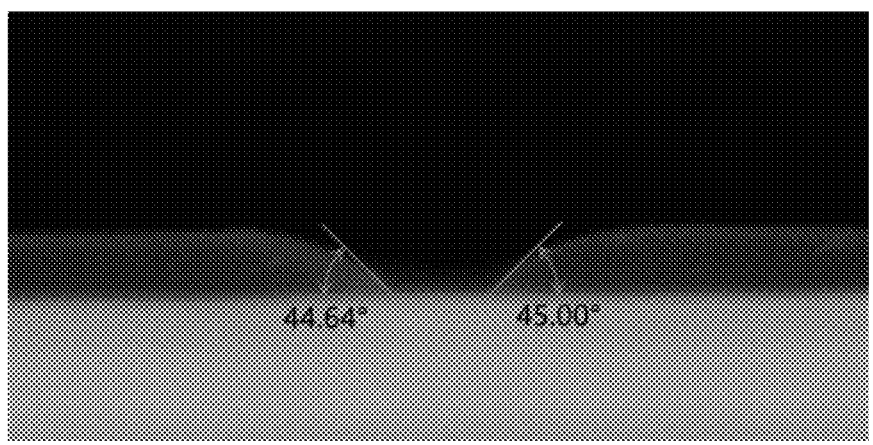
Figures 2, 4:
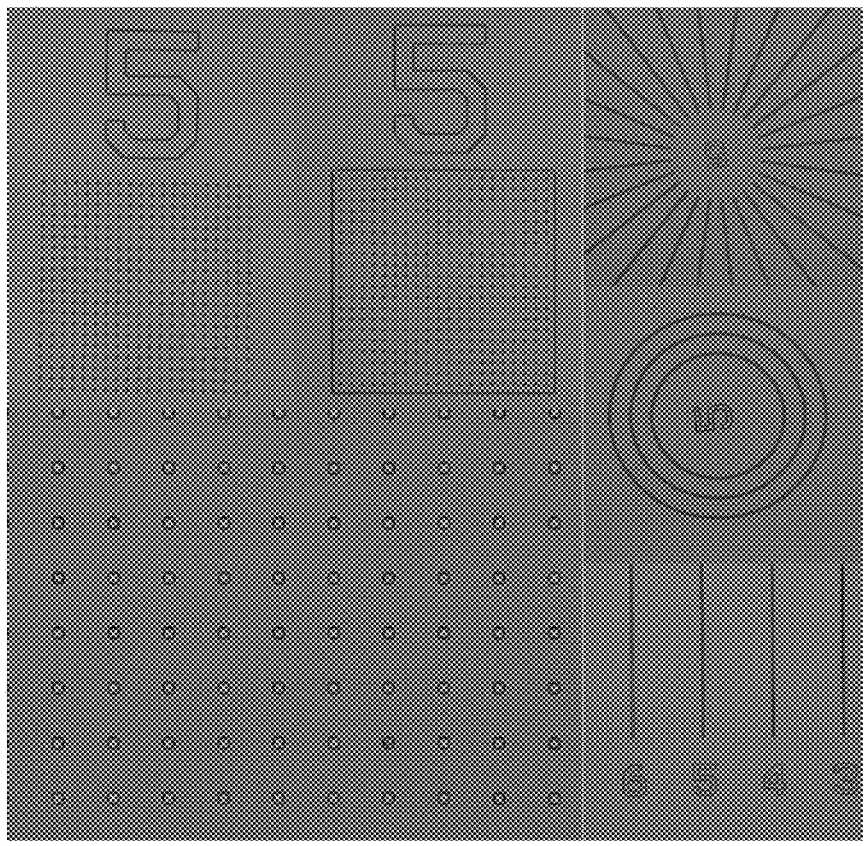

The lines and dot matrix patterns at 5 μm had no residual film. The lines were clear and neat, and the shape was considered to be good when the slope gradient was in a range of 30-70 degrees. The SEM diagram and micrograph of the example were shown in FIGS. 4-1 to 4-2.

Evaluation of Insulativity

Figure 2:
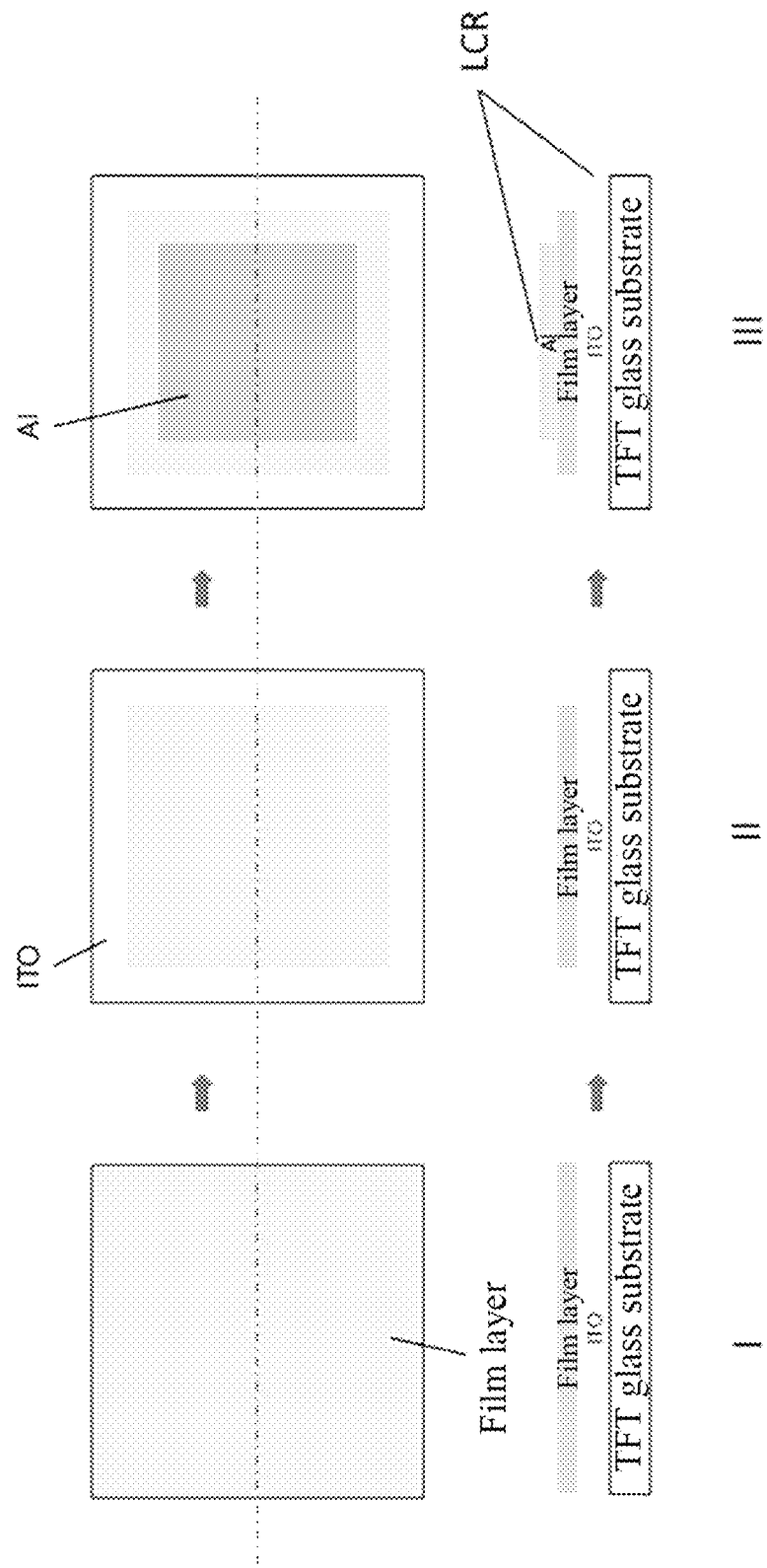
FIG. 2 shows a test box schematic diagram of the insulation evaluating of the cured film in the present disclosure.

A test box was made according to FIG. 2:

I. The solution of the prepared resin composition was coated on a 50 mm×50 mm glass substrate coated with a ITO film by using a rotary spin coater, and subjected to a baking on a hot plate at 110° C. for 120 s, forming a film layer.

II. The film layer was exposed by inserting the graphic mask as shown with an exposure amount of 100 mj/cm² by using an exposure machine (MJB4, GHI mixed lines manufacture by SUSS in Germany). Then, a developing treatment was conducted with an aqueous solution of 2.38% by mass tetramethylammonium hydroxide (developing solution) at 25° C. by static method, and the development was conducted for 60 s. After development, the film layer was cleaned with ultrapure water, blown dry with an $N_2$ gun, and hardened in a clean oven at 230° C. for 40 min, forming a 2 μm thick cured film of 40 mm×40 mm with an ITO-exposed edge on the substrate. The film thickness d (m) was detected by a VASE ellipsometer (VB-400 manufacture by J. A. Woollam in US).

III. At the position as shown in the figure, a 5 mm×5 mm Al electrode (S=7.85×10⁻⁵ m²) was formed on the cured film by a vacuum evaporation device (Shenyang Ultrahigh Vacuum Appliance Technology Research Institute). Then, the ITO-exposed part and the Al electrode were connected to an LCR instrument (Agilent 4284A), and detected for the capacitance C at 0.1 V, 100 KHz and 25° C., and the dielectric constant was calculated according to the following equation:

$$\text{Dielectric constant } K = \frac{C}{\varepsilon_0} \times \frac{d}{S}$$

$$\varepsilon 0 = 8.854 \times 10^{-12} F/m$$

The results of dielectric constant were shown in Table 3. The insulating property was considered to be good when the dielectric constant was below 3.3.

TABLE 3

Test results of performances of the cured films prepared in Examples 14-23 and Comparative Examples 5-6

| Components | | Example 14 | Example 15 | Example 16 | Example 17 | Example 18 | Example 19 | Comparative Example 5 | Comparative Example 6 | Example 20 | Example 21 | Example 22 | Example 23 |
|---|---|---|---|---|---|---|---|---|---|---|---|---|---|
| Test Result | Viscosity/cP | 6.5 | 6.8 | 6.3 | 6.9 | 6.4 | 6.5 | 6.6 | 6.4 | 7.5 | 7.6 | 4.8 | 4.8 |
| | Solid Content/% | 21.50 | 21.50 | 21.50 | 21.50 | 21.50 | 21.50 | 21.50 | 21.50 | 21.50 | 21.50 | 21.50 | 21.50 |
| | Surface | Clean and flat | Clean and flat | Clean and flat | Clean and flat | Clean and flat | Clean and flat | Slightly worse flatness | Slightly worse flatness | Clean and flat | Clean and flat | Clean and flat | Clean and flat |
| | Adhesion | A | B | A | A | B | B | C | B | A | B | A | A |
| | Transmittance (400 nm)/% | 95.6 | 94.5 | 95.1 | 95.2 | 94.5 | 94.1 | 93.2 | 91.9 | 98.5 | 96.2 | 98.2 | 98.4 |
| | Dielectric constant | 3.21 | 3.29 | 3.11 | 3.27 | 3.19 | 3.15 | 3.22 | 3.17 | 3.24 | 3.19 | 3.21 | 3.22 |
| | Heat resistance/° C. | 304.8 | 281.3 | 293.7 | 292.3 | 293.1 | 300.1 | 259.5 | 251.9 | 277.4 | 275.1 | 281.6 | 266.3 |
| | Solvent resistance NMP | 1.11 | 1.19 | 1.09 | 1.25 | 1.12 | 1.21 | 1.19 | 1.23 | 1.08 | 1.12 | 1.22 | 1.18 |
| | Solvent resistance IPA | 0.52 | 0.62 | 0.54 | 0.68 | 0.55 | 0.65 | 0.63 | 0.66 | 0.52 | 0.58 | 0.65 | 0.60 |
| | Alkali resistance | 4.02 | 4.26 | 4.38 | 4.05 | 4.67 | 4.28 | 6.31 | 7.32 | 4.55 | 4.06 | 3.98 | 4.25 |
| | Film Uniformity/% | A | A | A | A | A | A | A | B | A | A | A | A |
| | Sensitivity/(mj/cm$^2$) | 70 | 75 | 80 | 80 | 80 | 80 | 90 | 90 | 110 | 120 | 100 | 110 |
| | Graphic morphology | excellent | good | excellent | excellent | excellent | excellent | excellent | good | excellent | excellent | excellent | excellent |
| | Hardness | >H | >H | >H | >H | >H | >H | >HB | >HB | >H | >H | >H | >H |

Each example of the specification is described in a progressive manner, and each example focuses on the differences from other examples, and the same and similar parts between the examples can be seen from each other. For the device disclosed in the examples, since it corresponds to the method disclosed in the examples, the description is relatively simple, and reference can be seen in the method description.

The above description of the disclosed embodiments enables those skilled in the art to achieve or use the present disclosure. Various modifications to these embodiments are obvious to those skilled in the art, and the generic principles defined herein may be implemented in other embodiments without departing from the spirit or scope of the present disclosure. Thus, the present disclosure will not limited to the embodiments shown herein, but should conform to the widest scope consistent with the principles and novel features disclosed herein.

What is claimed is:

1. A fluorine-containing resin composition, comprising the following as raw materials, in parts by weight: 18 to 42 parts of a alkali-soluble resin (A) containing a compound (I), 2 to 8 parts of a photoinitiator, 0.3 to 1.2 parts of a sensitizer, 0 to 15 parts of a reactive diluent, 60 to 90 parts of a solvent, and 1 to 8 parts of an assistant;

a structural formula of a monomer of the compound (I) is shown as:

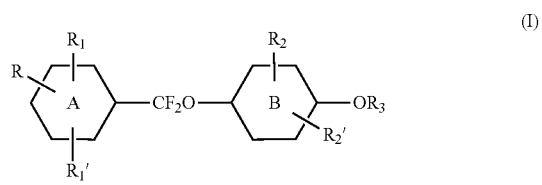

wherein R is selected from the group consisting of —CH=CH$_2$, —C(CH$_3$)=CH$_2$, acryloyl and methacryloyl;

$R_1$, $R_1'$, $R_2$, and $R_2'$ are each independently selected from the group consisting of hydrogen, hydroxyl, $C_1$-$C_4$ alkyl and $C_1$-$C_4$ alkoxy;

$R_3$ is selected from the group consisting of hydrogen and $C_1$-$C_6$ alkyl;

ring A is selected from the group consisting of cyclohexyl and phenyl; and, ring B is selected from the group consisting of phenyl, naphthyl and anthryl the photoinitiator is at least one selected from the group consisting of a phosphorus salt, an iodonium salt, an o-nitrobenzyl salt, and an oxime ketone ester, and the reactive diluent is a methacrylate monomer or an alicyclic monomer having a heterocyclic structure.

2. The fluorine-containing resin composition of claim 1, wherein a method for preparing the alkali-soluble resin (A) is performed as follows: adding 2 to 5 parts of the monomer of the compound (I), 1 to 5 parts of an acrylic monomer, 10 to 30 parts of a acrylate monomer, 2 to 5 parts of a maleimide monomer, 1 to 5 parts of an initiator, 0.2 to 1.0 parts of a molecular weight regulator and 50 to 84 parts of an organic solvent into a three-necked flask for mixing under stirring, and heating to 75-80° C., holding the temperature to react for 3-6 h, and cooling to room temperature to terminate the reaction, to obtain the alkali-soluble resin (A).

3. The fluorine-containing resin composition of claim 1, wherein:
the sensitizer is 4-hydroxybenzophenone and/or 4,4'-dihydroxybenzophenone; and,
the reactive diluent is a methacrylate monomer or an alicyclic monomer having a heterocyclic structure.

4. The fluorine-containing resin composition of claim 1, wherein:
the solvent is one at least selected from the group consisting of a diethylene glycol alkyl ether compound, a dipropylene glycol alkyl ether compound, a propylene glycol monoalkyl ether compound, a propylene glycol monoalkyl ether acetate compound, a N,N-dimethylamide compound, a lactate compound, ketone and a 3-alkoxypropionate compound; and,
the assistant is one at least selected from the group consisting of a surfactant, a defoaming agent, an antioxidant and a coupling agent.

5. A method for preparing a fluorine-containing resin composition, comprising:
weighing respective raw materials in parts by weight according to the fluorine-containing resin composition of claim 1, and stirring uniformly, and filtering the obtained mixture with a filter membrane with a thickness of 0.1-0.5 μm to obtain the fluorine-containing resin composition.

6. A method for preparing a cured film, comprising:
coating the fluorine-containing resin composition of claim 1 on a surface of a substrate, and subjecting to a soft baking, a light exposure, a development, a UV irradiation and a hardening to obtain the cured film.

7. The method of claim 6, wherein the soft baking is conducted at a temperature of 90-130° C. for 120 s-200 s;
the value of the exposure is in a range of 80 mJ-200 mJ;
the development is performed by: cleaning with a cleaning solvent;
the light intensity of the UV irradiation is in a range of 100-2000 mj/cm$^2$; and,
the hardening is performed by: baking the developed thin film at a temperature of 150-250° C.

8. The method of claim 6, wherein the fluorine-containing resin composition is prepared by the following method, comprising:
weighing respective raw materials in parts by weight according to the fluorine-containing resin composition of claim 1, and stirring uniformly, and filtering the obtained mixture with a filter membrane with a thickness of 0.1-0.5 μm to obtain the fluorine-containing resin composition.

\* \* \* \* \*